(12) United States Patent
Inoue et al.

(10) Patent No.: US 7,841,079 B2
(45) Date of Patent: Nov. 30, 2010

(54) ELECTRONIC COMPONENT MOUNTING SYSTEM AND ELECTRONIC COMPONENT MOUNTING METHOD

(75) Inventors: Masafumi Inoue, Saga (JP); Fumio Kikutsugi, Fukuoka (JP); Masahiro Kihara, Fukuoka (JP)

(73) Assignee: Panasonic Corporation, Osaka (JP)

( * ) Notice: Subject to any disclaimer, the term of this patent is extended or adjusted under 35 U.S.C. 154(b) by 281 days.

(21) Appl. No.: 12/123,950

(22) Filed: May 20, 2008

(65) Prior Publication Data

US 2008/0289175 A1 Nov. 27, 2008

(30) Foreign Application Priority Data

May 22, 2007 (JP) ............................. 2007-135133

(51) Int. Cl.
*H05R 3/34* (2006.01)
(52) U.S. Cl. .................. 29/840; 29/739; 29/740; 29/743; 29/833; 29/860
(58) Field of Classification Search .................. 29/739, 29/840, 740, 741, 743, 755, 833, 860, 843; 382/170, 145, 146, 147, 814; 228/104, 56.2, 228/12
See application file for complete search history.

(56) References Cited

U.S. PATENT DOCUMENTS 5,555,316 A * 9/1996 Tsujikawa et al. .......... 382/150
6,216,341 B1 * 4/2001 Nakahara ..................... 29/833
6,904,672 B2 * 6/2005 Nagafuku et al. ............. 29/840

FOREIGN PATENT DOCUMENTS

| JP | 06-112295 | | 4/1994 |
|---|---|---|---|
| JP | 09-097971 | A | 4/1997 |
| JP | 2002-271096 | A | 9/2002 |
| JP | 2006-019554 | A | 1/2006 |

OTHER PUBLICATIONS

Japanese Office Action.

* cited by examiner

*Primary Examiner*—Derris H Banks
*Assistant Examiner*—Tai Nguyen
(74) *Attorney, Agent, or Firm*—Pearne & Gordon LLP

(57) ABSTRACT

In electronic component mounting for a plurality of individual substrates held on a carrier, solder position deviation data is calculated for each individual substrate based on a mark position recognition result on a carrier after solder printing, a solder position recognition result, and electrode position information indicating the position of an electrode on each individual substrate, an operation of calculating position correction data, which is used to correct the positional deviation to mount electronic components at proper positions, is performed for each individual substrate based on the calculated solder position deviation data and the calculated position correction data is feed-forwarded to an electronic component mounting apparatus, and an electronic component mounting operation of a component mounting mechanism is controlled based on the mark position recognition result and the position correction data.

5 Claims, 12 Drawing Sheets

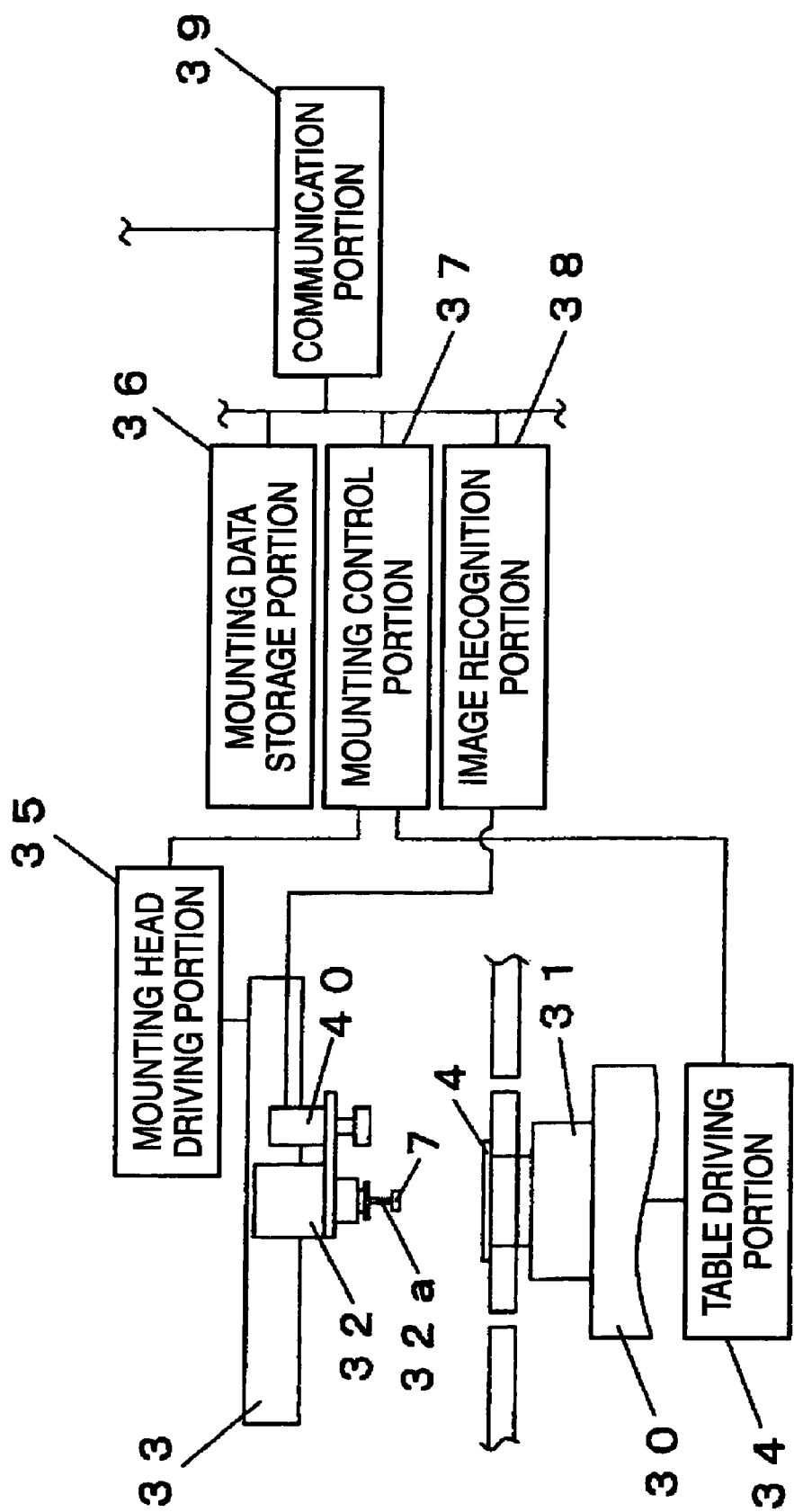

ELECTRONIC COMPONENT MOUNTING SYSTEM AND ELECTRONIC COMPONENT MOUNTING METHOD

BACKGROUND OF THE INVENTION

1. Field of the Invention

The present invention relates to an electronic component mounting system and an electronic component mounting method of mounting electronic components on a plurality of individual substrates held in a carrier by soldering to thereby manufacture an individual mounted board.

2. Related Art

An electronic component mounting system that mounts electronic components on a substrate by soldering to thereby manufacture a mounted board is formed by connecting a plurality of apparatuses for mounting of electronic components, such as a solder printing apparatus, an electronic component mounting apparatus, and a reflow apparatus. A technique for giving a function of automatically determining whether or not a component mounting operation has been properly performed by providing an inspection apparatus between apparatuses in order to perform quality control with high reliability in such an electronic component mounting system is known (for example, refer to Japanese Patent No. 3344739).

In an example disclosed in Japanese Patent No. 3344739, predetermined monitoring items are detected by providing an inspection apparatus in each portion of a mounting board production system formed by connecting a plurality of operation portions, such as a solder printing portion, a component mounting portion, and a soldering portion. For example, a cream solder printing inspection apparatus is provided in the solder printing portion and printing state monitoring items, such as failure in soldering and deviation of printing position, in a substrate printed by a printer are detected. In addition, in the case where these detection results deviate from a normal range and fall within an alarm region, facilities located at upstream and downstream sides are made to output an operation control instruction for correcting the results by changing the operation state. For example, when the printing position deviates with a specific tendency, an operation change instruction for correcting the positional deviation is output to the upstream printing apparatus and an operation change instruction for correcting the component mounting position according to the state of positional deviation is output to the downstream component mounting apparatus.

In recent years, a small-sized mounting board is widely used as an electronic apparatus is made small. In general, a component mounting work for such a small-sized board is collectively performed on a plurality of substrates in many cases. Accordingly, a form in which a plurality of small-sized individual substrates are held on a carrier is adopted. However, in the case when an inspection function of a known electronic component mounting line including the above-mentioned example in the related art is applied to such component mounting form in which a plurality of individual substrates are held on a carrier, the following problems occur. That is, when a plurality of individual substrates are held on a carrier, the individual substrates are not necessarily held at the accumulated positions set beforehand within the carrier but the positions usually vary in a predetermined range. For this reason, solder position information acquired by a print inspection apparatus could not be used and mounting position correction could not be efficiently performed in a component mounting process.

SUMMARY OF THE INVENTION

Therefore, it is an object of the invention to provide an electronic component mounting system and an electronic component mounting method capable of efficiently performing mounting position correction according to the solder printing position in a component mounting form in which a plurality of individual substrates are held on a carrier.

According to a first aspect of the invention, an electronic component mounting system that mounts electronic components on a plurality of individual substrates held in a carrier by soldering to thereby manufacture individual mounted boards, comprising:

a printing apparatus that collectively prints solder paste on a plurality of the electrodes for attachment of electronic components formed on each individual substrate;

a print inspection apparatus having a first mark position recognition portion capable of recognizing a position of a carrier recognition mark formed on the carrier and a position of a substrate recognition mark formed on each individual substrate, a solder position recognition portion that recognizes a position of the printed solder paste, and a solder position deviation calculating portion that calculates solder position deviation data for each individual substrate indicating positional deviation of the solder paste on each individual substrate based on a mark position recognition result obtained by the first mark position recognition portion, a solder position recognition result obtained by the solder position recognition portion and electrode position information indicating positions of the electrodes on each individual substrate;

a position correction data calculating portion that performs an operation of calculating position correction data, which is used to correct the positional deviation to mount the electronic components at proper positions, based on the solder position deviation data for each individual substrate; and an electronic component mounting apparatus having a component mounting mechanism that picks up the electronic components from a component supply portion by a mounting head and mounts the electronic components on each individual substrate on which the solder paste is printed, a second mark position recognition portion capable of recognizing the position of the carrier recognition mark and a position of the substrate recognition mark, and a mounting control portion that controls an electronic component mounting operation of the component mounting mechanism based on the position correction data and the mark position recognition result obtained by the second mark position recognition portion.

According to a second aspect of the invention, an electronic component mounting method of mounting electronic components on a plurality of individual substrates held on a carrier such so as to be fixed by an adhesive resin coat provided on a surface of the carrier by soldering to thereby manufacture individual mounted boards, comprising:

printing solder paste collectively on a plurality of electrodes for attachment of the electronic components on each individual substrate;

performing a first mark position recognition process of recognizing a position of a carrier recognition mark formed on the carrier and a position of a substrate recognition mark formed on each individual substrate;

performing a solder position recognition process of detecting a position of the printed solder paste;

performing a solder position deviation calculating process of calculating solder position deviation data for each individual substrate indicating positional deviation of the solder paste on each individual substrate and a relative position of each individual substrate with respect to the carrier based on a mark position recognition result obtained in the first mark position recognition, a solder position recognition result obtained in the solder position recognition, and electrode position information indicating positions of the electrodes on each individual substrate;

performing a position correction data calculating process of calculating position correction data, which is used to correct the positional deviation to mount the electronic components at proper positions, based on the solder position deviation data for each individual substrate;

performing a second mark position recognition process of recognizing the position of the carrier recognition mark on the carrier after printing the solder paste; and performing a component mounting process of picking up the electronic components from a component supply portion by a mounting head and mounting the electronic components on each individual substrate on which the solder paste is printed by controlling an electronic component mounting operation of a component mounting mechanism based on the position correction data and the mark position recognition result obtained in the second mark position recognition process.

In addition, according to a third aspect of the invention, an electronic component mounting method of mounting electronic components on a plurality of individual substrates, which are held in substrate holding portions provided in a carrier with a positioning error, by soldering to thereby manufacture an individual mounted boards, comprising:

printing solder paste collectively on a plurality of electrodes for attachment of the electronic components, which are formed on each individual substrate;

performing a first mark position recognition process of recognizing the position of a substrate recognition mark formed on each individual substrate;

performing a solder position recognition process of detecting a position of the printed solder paste;

performing a solder position deviation calculating process of calculating solder position deviation data for each individual substrate indicating positional deviation of the solder paste on each individual substrate based on a mark position recognition result obtained in the first mark position recognition process, a solder position recognition result obtained in the solder position recognition process, and electrode position information indicating positions of the electrodes on each individual substrate;

performing a position correction data calculating process of calculating position correction data, which is used to correct the positional deviation to mount the electronic components at proper positions, based on the solder position deviation data for each individual substrate;

performing a second mark position recognition process of recognizing the position of the substrate recognition mark on the carrier after printing the solder paste; and performing a component mounting process of picking up the electronic components from a component supply portion by a mounting head and mounting the electronic components on each individual substrate on which the solder paste is printed by controlling an electronic component mounting operation of a component mounting mechanism based on the position correction data and the mark position recognition result obtained in the second mark position recognition process.

According to the aspects of the invention, there is adopted a configuration in which solder position deviation data indicating the positional deviation of solder paste on each individual substrate is calculated for each individual substrate based on a mark position recognition result on a substrate recognition mark, a solder position recognition result on the printed solder paste, and electrode position information indicating the position of an electrode on each individual substrate, an operation of calculating position correction data, which is used to correct the positional deviation to mount electronic components at proper positions, is performed for each individual substrate based on the calculated solder position deviation data, and an electronic component mounting operation of the component mounting mechanism is controlled based on the mark position recognition result and the position correction data feed-forwarded in the electronic component mounting apparatus. As a result, mounting position correction in the component mounting form in which a plurality of individual substrates are held on a carrier can be efficiently performed.

BRIEF DESCRIPTION OF THE DRAWINGS

FIG. 4 is a block diagram illustrating the configuration of an electronic component mounting apparatus in the electronic component mounting system according to the embodiment of the invention.

DETAILED DESCRIPTION OF THE PREFERRED EMBODIMENTS

Figure 1:
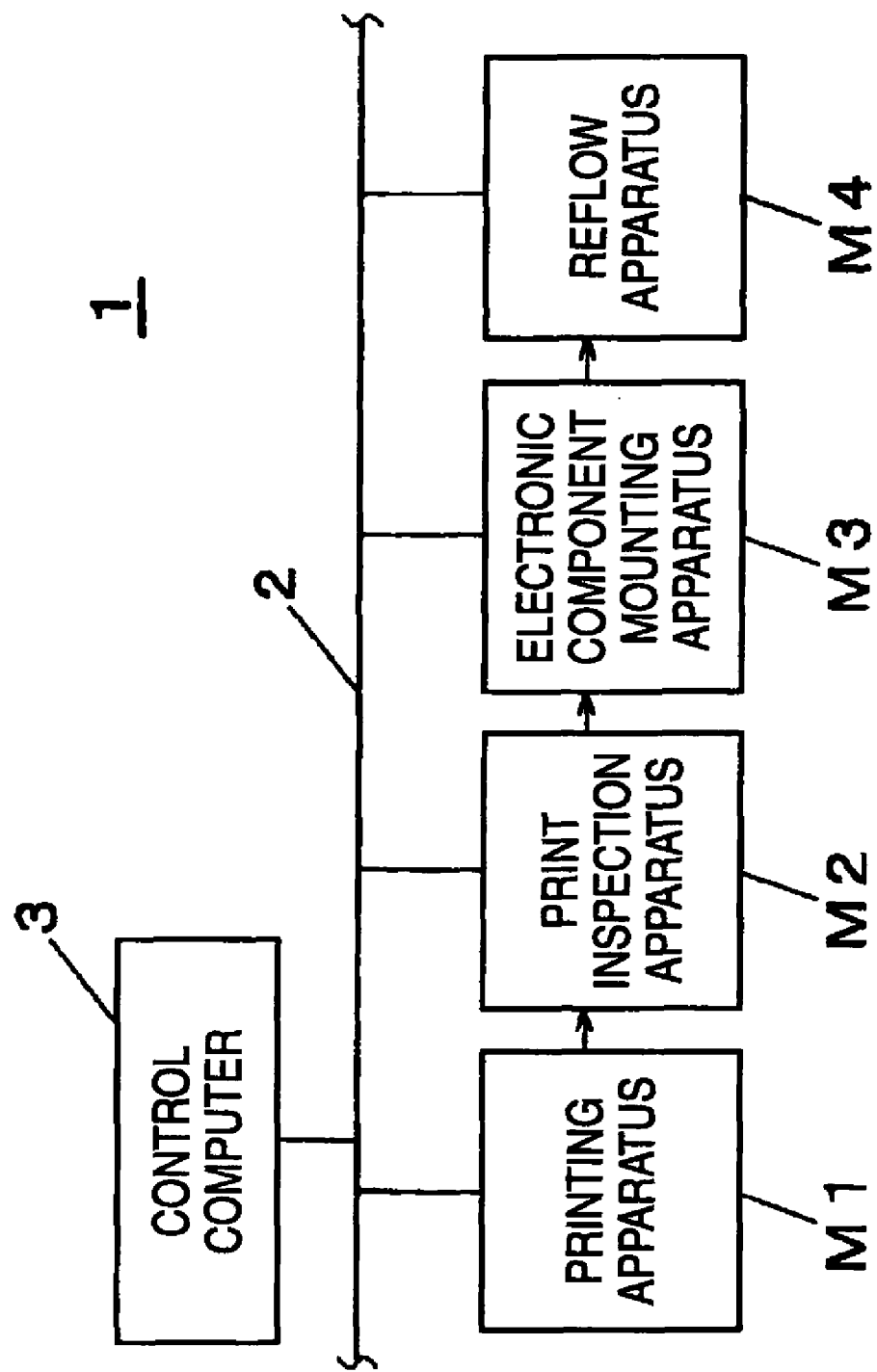
FIG. 1 is a block diagram illustrating the configuration of an electronic component mounting system according to an embodiment of the invention.
Figure 2:
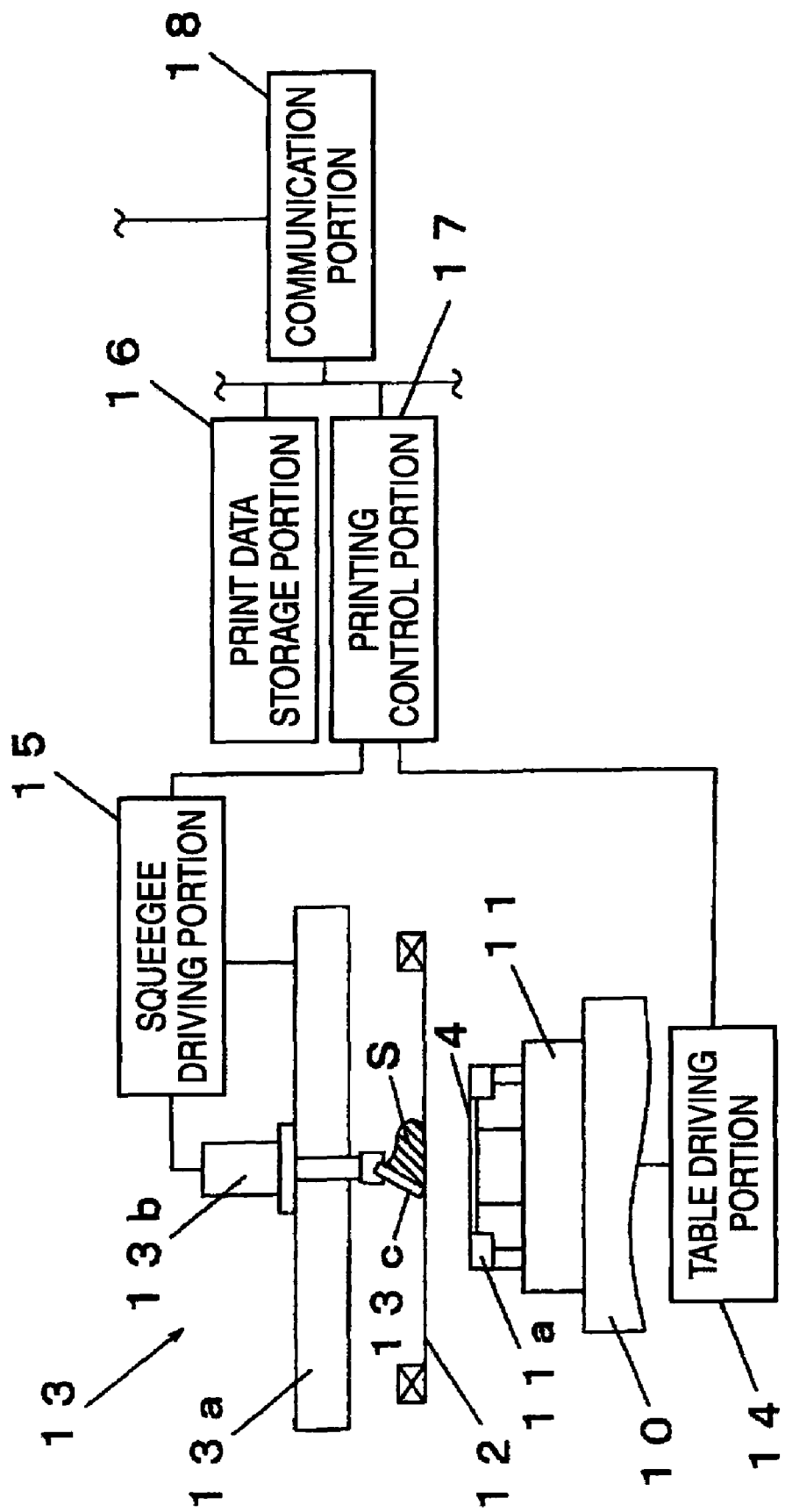
FIG. 2 is a block diagram illustrating the configuration of a printing apparatus in the electronic component mounting system according to the embodiment of the invention.
Figure 3:
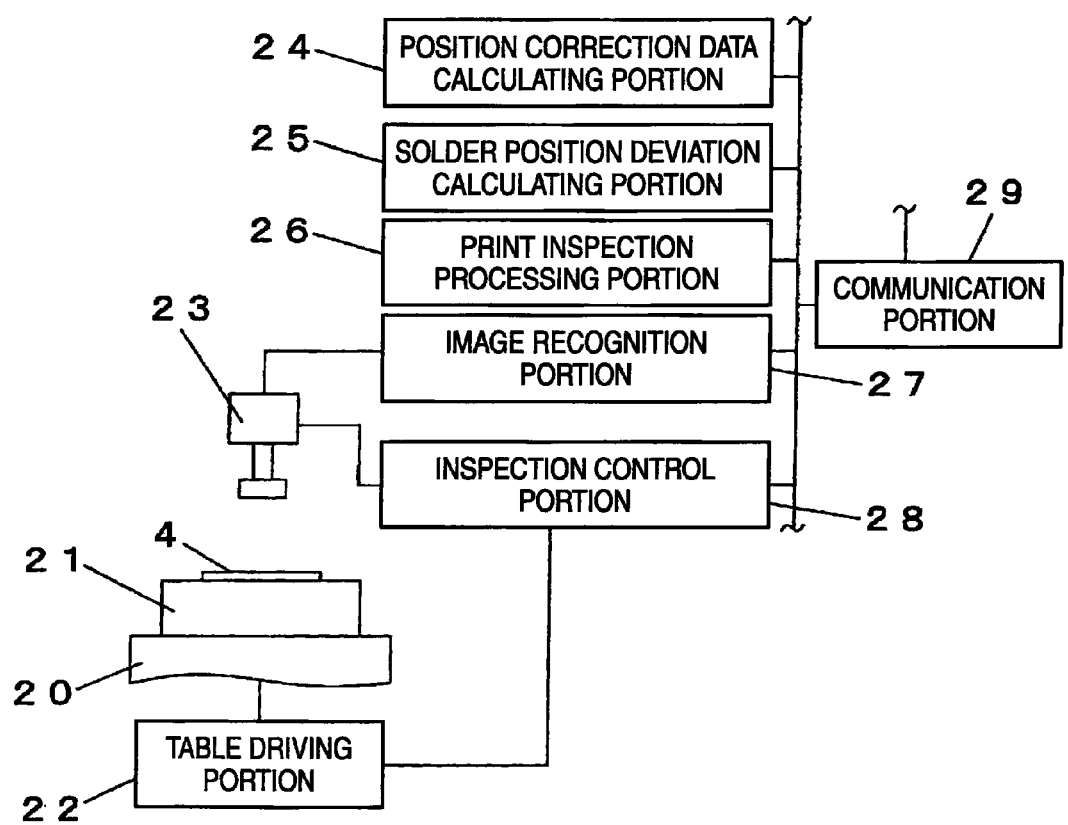
FIG. 3 is a block diagram illustrating the configuration of a print inspection apparatus in the electronic component mounting system according to the embodiment of the invention.
Figure 8A:
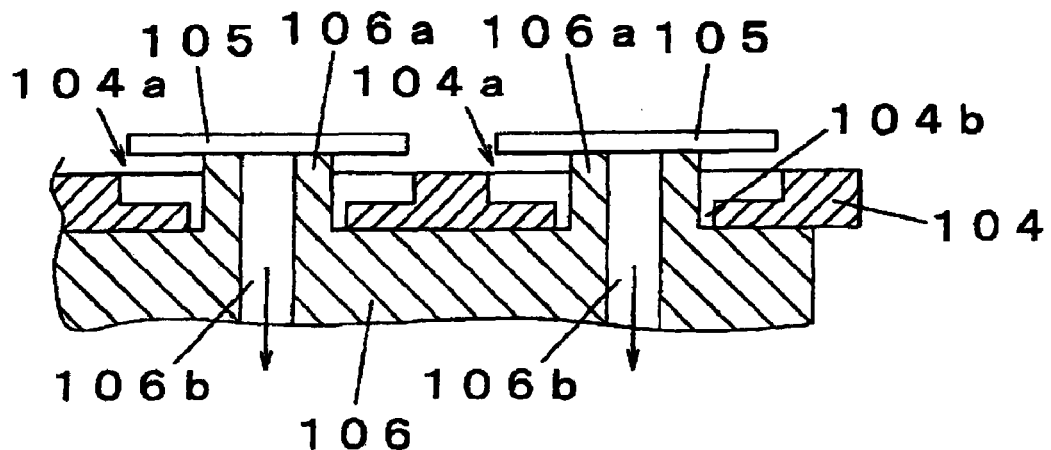
FIGS. 8A and 8B are explanatory views illustrating the structures of targeted carrier and individual substrates in the electronic component mounting system according to the embodiment of the invention.
Figure 8B:
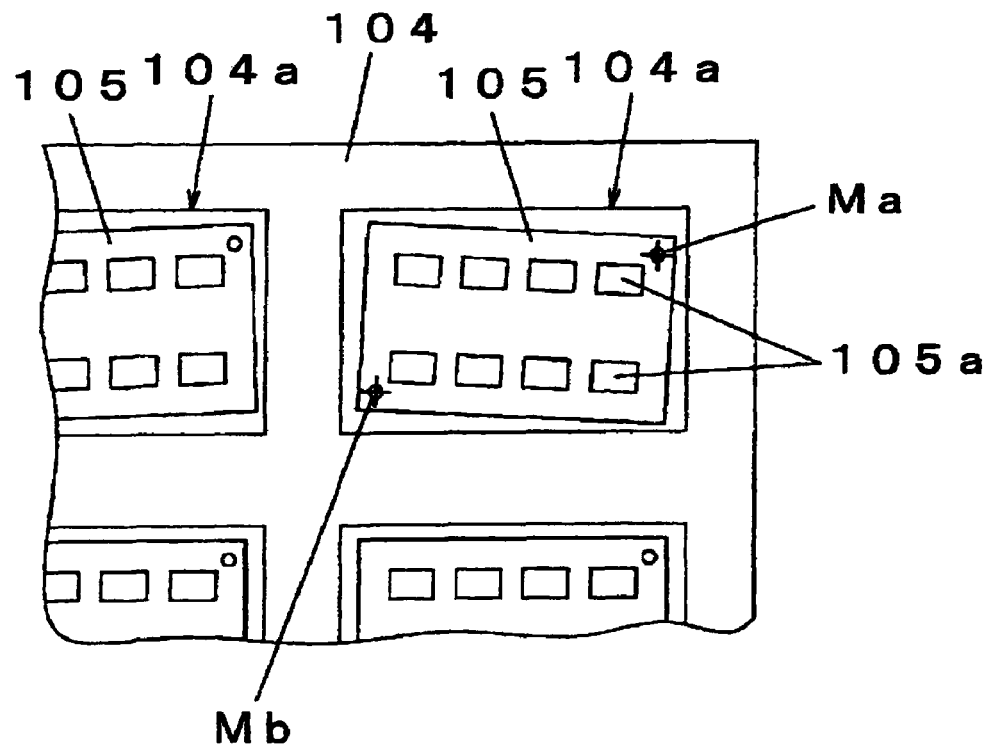
Figure 9:
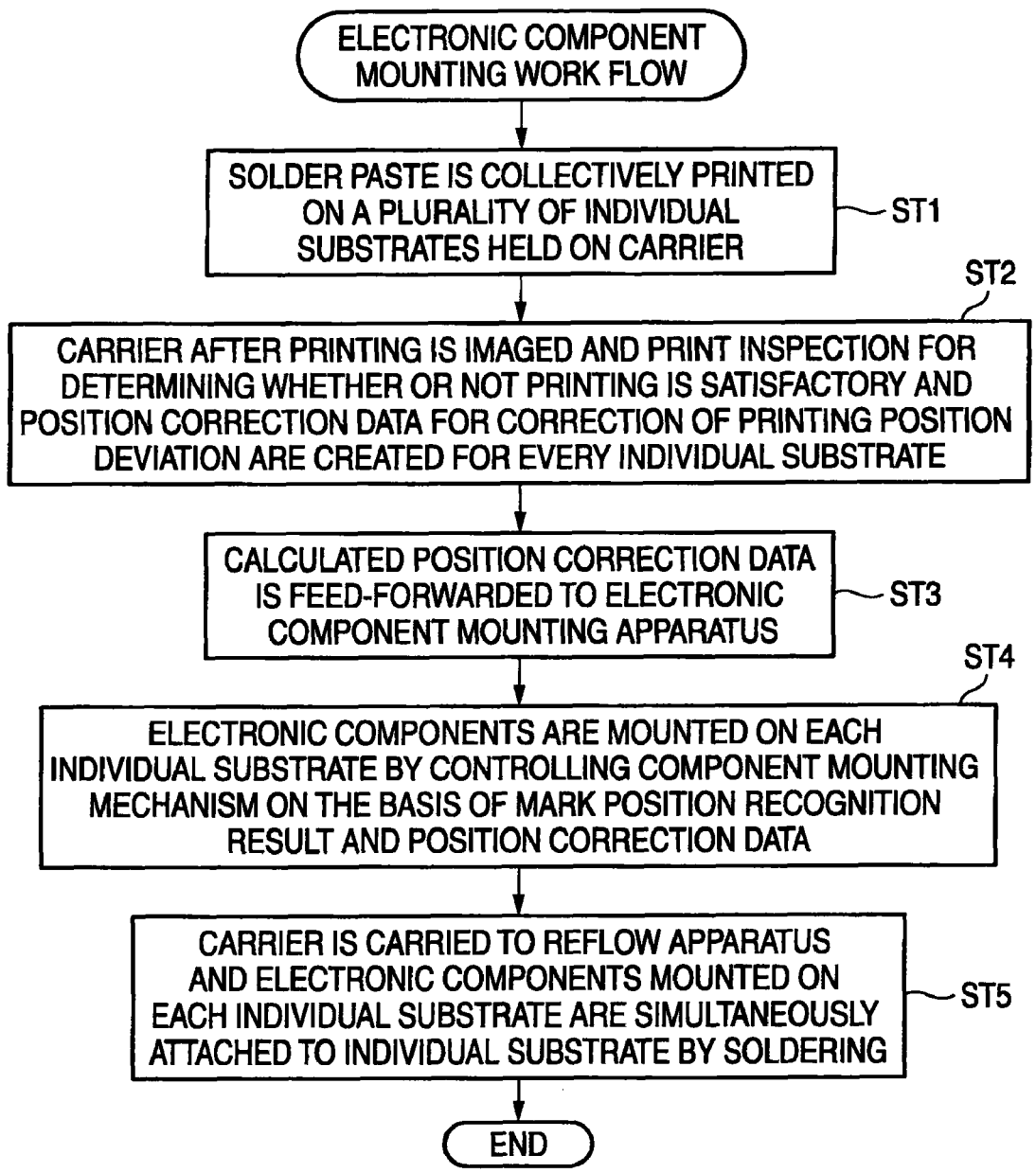
FIG. 9 is a block diagram illustrating an electronic component mounting method, which is used in the electronic component mounting system, according to another embodiment of the invention.
Figure 10:
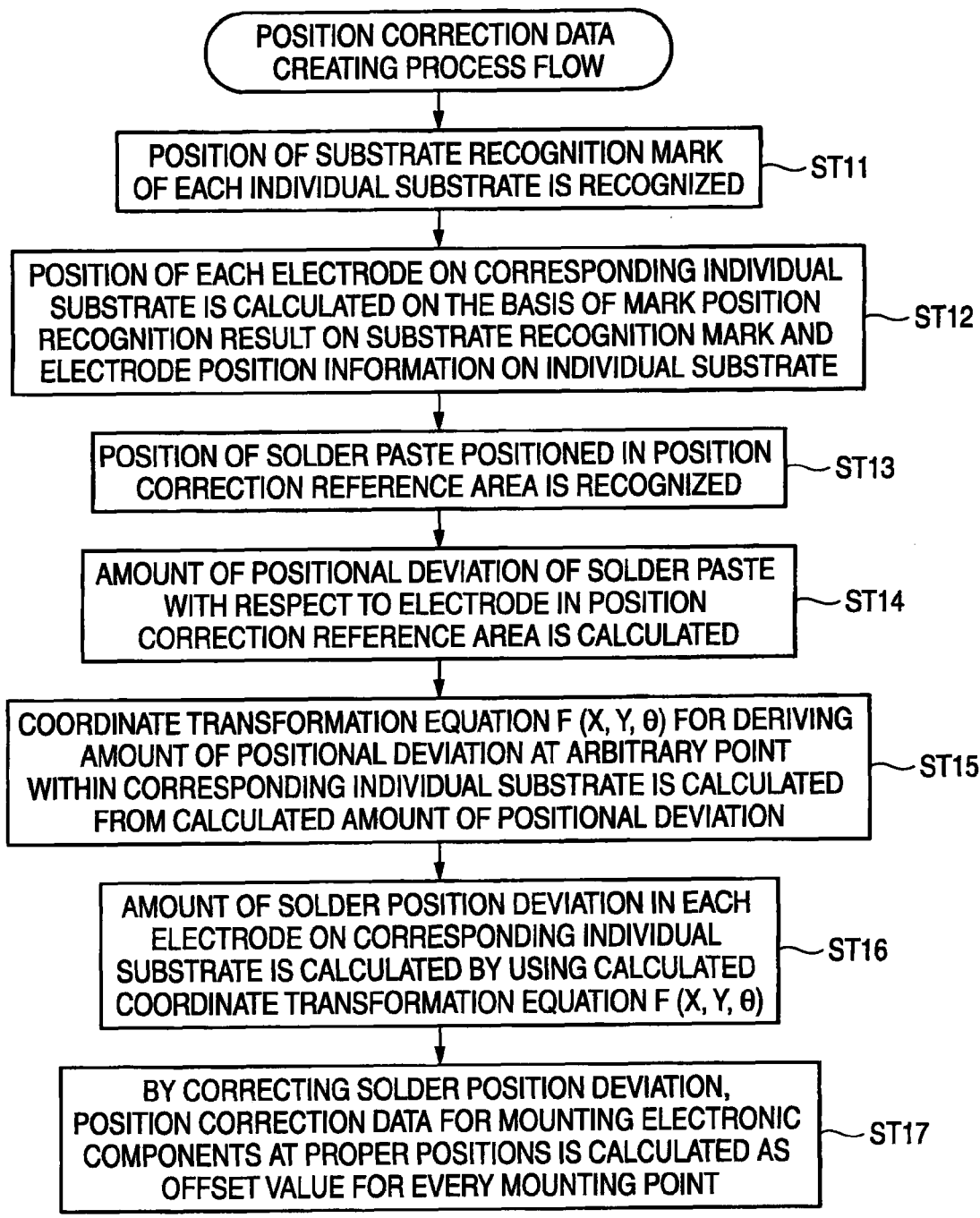
FIG. 10 is a block diagram illustrating position correction data creating processing in the electronic component mounting method according to the embodiment of the invention.

Hereinafter, embodiment of the invention will be described with reference to the accompanying drawings. FIG. 1 is a block diagram illustrating the configuration of an electronic component mounting system according to an embodiment of the invention. FIG. 2 is a block diagram illustrating the configuration of a printing apparatus in the electronic component mounting system according to the embodiment of the invention. FIG. 3 is a block diagram illustrating the configuration of a print inspection apparatus in the electronic component mounting system according to the embodiment of the invention. FIG. 4 is a block diagram illustrating the configuration of an electronic component mounting apparatus in the electronic component mounting system according to the embodiment of the invention. FIGS. 5A to 5C, 6A and 6B, 7A to 7C, and 8A and 8B are explanatory views illustrating the structures of targeted carrier and individual substrates in the electronic component mounting system according to the embodiment of the invention. FIG. 9 is a block diagram illustrating an electronic component mounting method, which is used in the electronic component mounting system, according to another embodiment of the invention. FIG. 10 is a block diagram illustrating position correction data creating processing in the electronic component mounting method according to the embodiment of the invention. FIGS. 11A to 11C and 12A to 12D are explanatory views illustrating position correction data creating processing in the electronic component mounting method according to the embodiment of the invention.

First, an electronic component mounting system will be described with reference to FIG. 1, In FIG. 1, the electronic component mounting system is configured such that an electronic component mounting line 1, which is formed by connecting a printing apparatus M1, a print inspection apparatus M2, an electronic component mounting apparatus M3, and a reflow apparatus M4, is connected through a communication network 2 and the entire system is controlled by a control computer 3. The printing apparatus M1 performs screen printing of solder paste used to attach electronic components on electrodes of a plurality of individual substrates held on the carrier. The print inspection apparatus M2 performs print inspection for determining whether or not a print state in an individual substrate after printing is satisfactory and performs processing for creating positional deviation correction data that is feed-forwarded to the electronic component mounting apparatus M3 for correction of printing position deviation. The electronic component mounting apparatus M3 mounts electronic components on the individual substrate on which solder paste is printed.

The reflow apparatus M4 heats and melts the solder by heating the individual substrate after mounting the electronic components, such that the electronic components are attached to the individual substrate by soldering.

In the present embodiment, the electronic component mounting line 1 having the above-described configuration is used to mount electronic components on a small substrate used in a small electronic apparatus, such as a mobile phone. A work in a mounting operation has a shape in which a plurality of individual substrates are held on a carrier. A processing work performed by each of the above apparatuses and a conveying work are performed in a state where all of the plurality of individual substrates are held on a carrier.

Figure 5A:
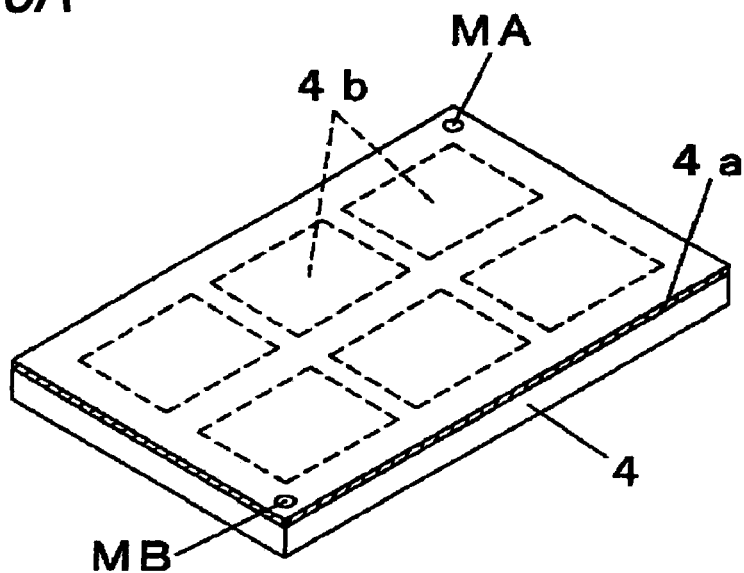
FIGS. 5A to 5C are explanatory views illustrating the structures of targeted carrier and individual substrates in the electronic component mounting system according to the embodiment of the invention.
Figure 5B:
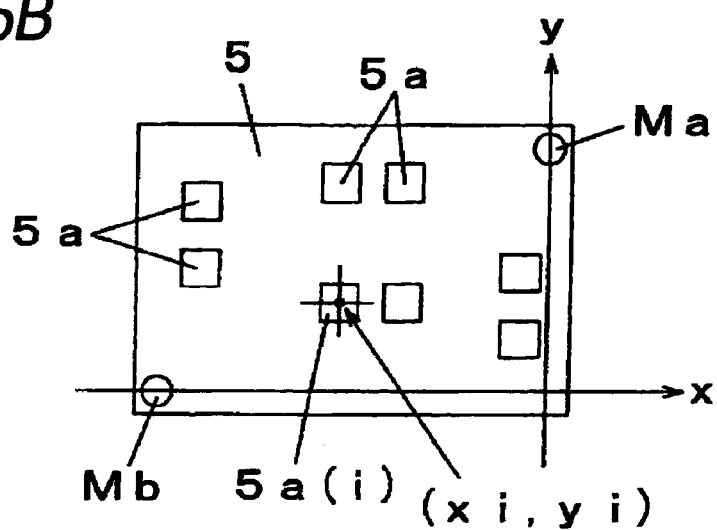
Figure 5C:
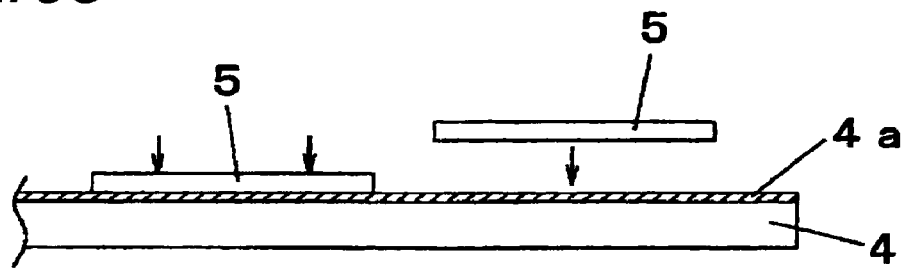

First, the configuration of an individual substrate 5 targeted and the configuration of a carrier 4 used to hold the plurality of individual substrates 5 will be described with reference to FIGS. 5A to 5C, 6A and 6B, and 7A to 7C. FIGS. 5A to 5C show the carrier 4 for holding the individual substrate 5 having a thin film shape. As shown in FIG. 5A, a coat 4a formed of adhesive resin is provided on a surface of the carrier 4 and a plurality of component mounting positions 4b, in which the individual substrates 5 shown in FIG. 5B are placed, are provided on an upper surface of the coat 4a. Carrier recognition marks MA and MB for position recognition of the carrier 4 are formed at opposite diagonal positions of the carrier 4.

The individual substrate 5 is formed with a plurality of electrodes 5a for connection with a plurality of electronic components and substrate recognition marks Ma and Mb for position recognition of the individual substrate 5. The position of each electrode 5a on the individual substrate 5 is stored beforehand in a storage portion provided in each of the printing apparatus M1, the print inspection apparatus M2, and the electronic component mounting apparatus M3 or a storage device of the control computer 3, as electrode position information indicating a coordinate value (xi, yi) of an individual electrode $5a(i)$ in an individual substrate coordinate system specified by the substrate recognition marks Ma and the Mb.

When the individual substrate 5 is held on the carrier 4, a mounting guide fixture (not shown) in which openings are provided corresponding to the shape and array of the component mounting positions 4b is set on an upper surface of the carrier 4. Then, the individual substrate 5 mounted through the opening of the mounting guide fixture is pressed against the upper surface of the coat 4a, as shown in FIG. 5C. Then, the air between a lower surface of the individual substrate 5 and the upper surface of the coat 4a is eliminated, and accordingly, the individual substrate 5 and the coat 4a are pressed against each other. As a result, the relative positions of the individual substrate 5 and the coat 4a are fixed. Handling of the individual substrate 5 is performed in the state where the plurality of individual substrates 5 are held on the carrier 4 in the manner described above.

Figure 6A:
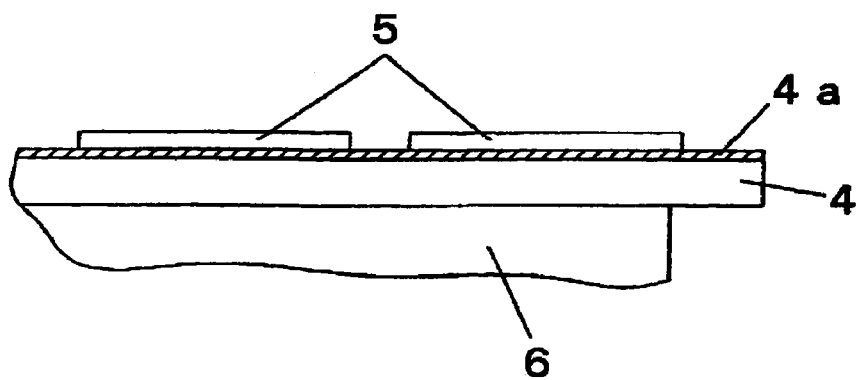
FIGS. 6A and 6B are explanatory views illustrating the structures of targeted carrier and individual substrates in the electronic component mounting system according to the embodiment of the invention.

Conveyance of the individual substrate 5 is performed for each carrier 4. When a work for the individual substrate 5 is performed in each apparatus, the work is performed in a state where a lower surface of the carrier 4, which holds the plurality of individual substrates 5 thereon, is supported by a lower part receiving member 6 provided in each apparatus, as shown in FIG. 6A. In this state, the positions of the individual substrates 5 placed on the carrier 4 does not necessarily make a completely regular array, but each of the individual substrates 5 randomly deviates from the component mounting position 4b in many cases.

That is, in the plurality of individual substrates 5 held on the same carrier 4, the position of the electrode 5a formed on each individual substrate 5 deviates from the regular position, the positional deviation changing according to each of the individual substrates 5. For this reason, in order to identify the position of the electrode 5a in the carrier 4, the relative positions of the substrate recognition marks Ma and Mb of each individual substrate 5 with respect to the carrier recognition marks MA and MB formed in the carrier 4 are needed. However, in a state where the individual substrate 5 is held on the carrier 4 with the coat 4a provided therebetween, the position of each individual substrate 5 with respect to the carrier 4 is fixed. Accordingly, once the relative positions of the substrate recognition marks Ma and Mb of each individual substrate 5 with respect to the carrier recognition marks MA and MB are calculated to be stored, this relative position information can also be used in subsequent processes.

Figure 7A:
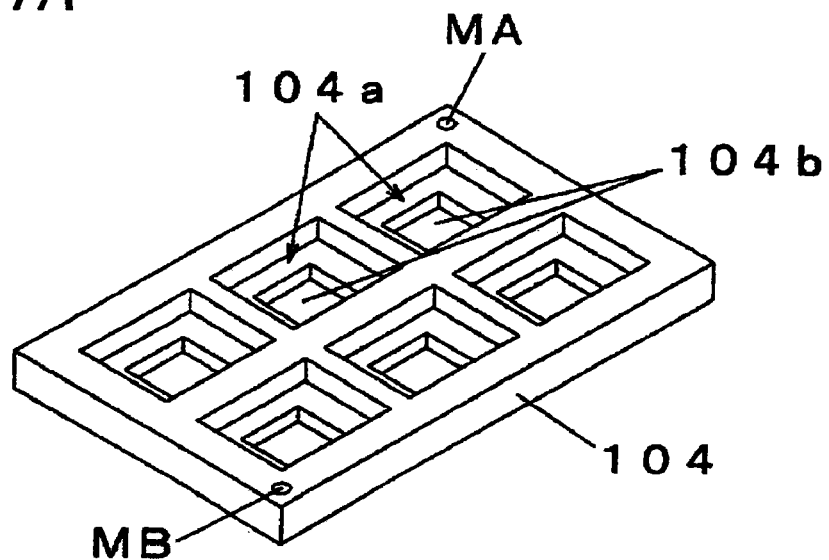
FIGS. 7A to 7C are explanatory views illustrating the structures of targeted carrier and individual substrates in the electronic component mounting system according to the embodiment of the invention.
Figure 7B:
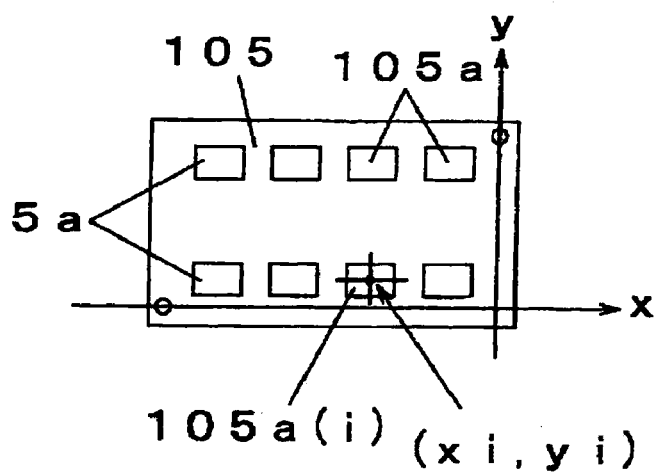
Figure 7C:
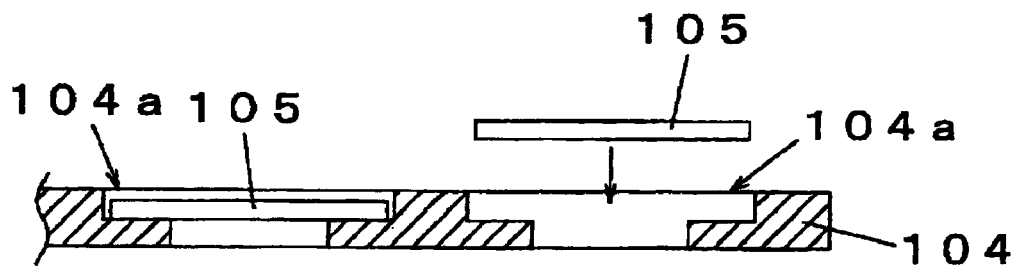

FIGS. 7A to 7C show a carrier 104 on which an individual substrate 105, which is not easily in close contact with the carrier 4 and is not easily fixedly held unlike the above individual substrate 5, is placed. As shown in FIG. 7A, a recessed substrate holding portion 104a into which the individual substrate 105 shown in FIG. 7B is inserted is provided on an upper surface of the carrier 104. A through hole 104b passing through a bottom surface side of the carrier 104 is provided on a lower surface of the substrate holding portion 104a. Carrier recognition marks MA and MB for position recognition of the carrier 104 are formed at opposite diagonal positions of the carrier 104.

The individual substrate 105 is formed with a plurality of electrodes 105a for connection with electronic components and substrate recognition marks Ma and Mb for position recognition of the individual substrate 105. Similar to the individual substrate 5, the position of each electrode 105a on the individual substrate 105 is stored beforehand in a storage portion provided in each apparatus, as electrode position information indicating a coordinate value (xi, yi) of an individual electrode 105a(i) in an individual substrate coordinate system specified by the substrate recognition marks Ma and the Mb.

When making the individual substrate 105 held on the carrier 104, the individual substrate 105 is placed inside the substrate holding portion 104a, as shown in FIG. 7C. The shape and size of the substrate holding portion 104a are set such that the individual substrate 105 is inserted into the substrate holding portion 104a with some dimensional tolerance. Accordingly, a position error corresponding to the tolerance occurs in each of the plurality of individual substrates 105 held on the carrier 104. That is, the plurality of individual substrates 105 are held in the substrate holding portion 104a provided in the carrier 104 with a positioning error, and handling of the individual substrate 105 is performed in such a state.

Conveyance of the individual substrate 105 is performed for each carrier 104. When a work for the individual substrate 105 is performed in each apparatus, the work is performed in a state where a lower surface of the carrier 104, which holds the plurality of individual substrates 105 thereon, is supported by a lower part receiving member 106 provided in each apparatus, as shown in FIG. 8A. At this time, a protruding portion 106a provided in the lower part receiving member 106 passes through the through hole 104b to raise the individual substrate 105 from the substrate holding portion 104a. Then, by performing vacuum suction through a suction hole 106b formed in the protruding portion 106a, each of the individual substrates 105 is positioned and held on the protruding portion 106a by vacuum suction.

Also in the case of using the carrier 104 having such a configuration, a position error corresponding to the above-described tolerance always occurs at the position of the individual substrate 105 in the state where the individual substrate 105 is inserted into the substrate holding portion 104a, and a state of the position error changes whenever the carrier 104 moves. For this reason, in order to identify the position of the electrode 105a in the carrier 104, the positions of the substrate recognition marks Ma and Mb of each individual substrate 105 need to be recognized whenever the position identification is requested.

Next, the configuration of each apparatus will be described. In the following explanation on each apparatus, only an example of the individual substrate 5 held on the carrier 4 will be described. However, the same is true for a case where the individual substrate 105 is held on the carrier 104. First, the configuration of the printing apparatus M1 will be described with reference to FIG. 2. In FIG. 2, a carrier holding portion 11 is provided on a positioning table 10. The carrier holding portion 11 holds the carrier 4, on which the plurality of individual substrates 5 are held, so as to be inserted between both sides by clampers 11a. A mask plate 12 is provided above the carrier holding portion 11 and a pattern hole (not shown) corresponding to a printing portion of each of the individual substrates 5 held on the carrier 4 is provided in the mask plate 12. When a table driving portion 14 drives the positioning table 10, the carrier 4 makes a relative movement in horizontal and vertical directions with respect to the mask plate 12.

A squeegee portion 13 is provided above the mask plate 12. The squeegee portion 13 includes a vertical movement and pressing mechanism 13b, which vertically moves a squeegee 13c with respect to the mask plate 12 and presses the mask plate 12 with predetermined pressure, and a squeegee moving mechanism 13a that horizontally moves the squeegee 13c. The vertical movement and pressing mechanism 13b and the squeegee moving mechanism 13a are driven by a squeegee driving portion 15. By horizontally moving the squeegee 13c in a predetermined speed along a top surface of the mask plate 12 to which solder paste S is supplied in a state where the plurality of individual substrates 5 held on the carrier 4 are made to be in contact with a bottom surface of the mask plate 12, solder paste S is collectively printed, through pattern holes (not shown), on the plurality of electrodes 5a for attachment of electronic components which are formed in each of the individual substrates 5.

This printing operation is performed by causing a printing control portion 17 to control the table driving portion 14 and the squeegee driving portion 15. At the time of this control, an operation of the squeegee 13c and alignment of the carrier 4 and the mask plate 12 are controlled based on print data stored in a print data storage portion 16. A communication portion 18 transmits/receives data to/from the control computer 3 or the other apparatuses provided in the electronic component mounting line 1 through the communication network 2.

Next, the print inspection apparatus M2 will be described with reference to FIG. 3. In FIG. 3, a carrier holding portion 21 is provided on a positioning table 20 and the carrier 4 that holds the plurality of individual substrates 5 thereon is held on the carrier holding portion 21. Above the carrier holding portion 21, a camera 23 is provided with imaging direction downward. The camera 23 images the carrier 4 in a state where solder is printed on each individual substrate 5 by the printing apparatus M1. An inspection control portion 28 controls an inspection operation by controlling the table driving portion 22 and the camera 23. By driving the positioning table 20 by controlling the table driving portion 22 with the inspection control portion 28, imaging can be performed in a state where the arbitrary position of the carrier 4 is located immediately below the camera 23.

Image data acquired by imaging is subjected to recognition processing by an image recognition portion 27. As a result, it becomes possible to recognize the positions of the carrier recognition marks MA and MB formed in the carrier 4 and the positions of the substrate recognition marks Ma and Mb formed in each of the plurality of individual substrates 5. In addition, by performing the recognition processing on the acquired image data, the position of solder paste, which is printed on each electrode in each of the plurality of individual substrates 5 held on the carrier 4 by the printing apparatus M1, is recognized. That is, the camera 23 and the image recognition portion 27 serve as both a first mark position recogniportion, which can recognize the positions of the carrier recognition marks MA and MB formed in the carrier 4 and the positions of the substrate recognition marks Ma and Mb formed in each of the individual substrates 5, and a solder position recognition portion that recognizes the position of the solder paste S printed on the individual substrate 5.

A print inspection processing portion 26 performs print inspection for determining whether or not a solder printing state is satisfactory based on a position recognition result on the printed solder paste. A solder position deviation calculating portion 25 performs processing for calculating solder position deviation data, which indicates the positional deviation of the solder paste S on each of the individual substrates 5, for each individual substrate 5 based on the mark position recognition result and the solder position recognition result obtained when the image recognition portion 27 performs recognition processing on the image data and the electrode position information (refer to FIGS. 5B and 7B) indicating the position of an electrode on each individual substrate 5. A position correction data calculating portion 24 performs an operation of calculating position correction data that is used to correct the positional deviation of the solder paste S on each individual substrate 5 to mount electronic components at proper positions, for each individual substrate 5, based on the solder position deviation data calculated by the solder position deviation calculating portion 25.

Next, the configuration of the electronic component mounting apparatus M3 will be described with reference to FIG. 4. In FIG. 4, a carrier holding portion 31 is provided on a positioning table 30 and the carrier holding portion 31 holds the carrier 4 conveyed from print inspection apparatus M2 thereon. A mounting head 32 and a camera 40 that are moved by a head driving mechanism 33 are provided above the carrier holding portion 31. The mounting head 32 is provided with a nozzle 32a for suction of electronic components. The mounting head 32 sucks and holds an electronic component 7 from a component supply portion (not shown) by using the nozzle 32a and take outs the electronic component 7. Then, by moving the mounting head 32 onto the carrier 4 to move the mounting head 32 downward toward the carrier 4, electronic components held on the nozzle 32a are mounted on the plurality of individual substrates 5 held on the carrier 4. The mounting head 32, the head moving mechanism 33, and the mounting head driving portion 35 form a component mounting mechanism that picks up electronic components from a component supply portion by the mounting head 32 and mounts the electronic components on each individual substrate 5 on which solder paste is printed.

The camera 40 images an upper surface of the carrier 4 and image data acquired by the camera 40 is subjected to recognition processing by an image recognition portion 38. As a result, it becomes possible to recognize the positions of the carrier recognition marks MA and MB formed in the carrier 4 and the positions of the substrate recognition marks Ma and Mb formed in each of the plurality of individual substrates 5. Thus, the camera 40 and the image recognition portion 38 serve as a second mark position recognition portion that can recognize the positions of carrier recognition marks and substrate recognition marks.

The head driving mechanism 33 and the positioning table 30 are driven by the mounting head driving portion 35 and the table driving portion 34, respectively. Mounting position data indicating a mounting position coordinate in the individual substrate 5 held on the carrier 4 to be mounted is stored as mounting data in a mounting data storage portion 36. In a component mounting operation of the mounting head 32, a mounting control portion 37 causes electronic components to be mounted at the component mounting positions of the individual substrate 5 held on the carrier 4 by controlling the table driving portion 34 and the mounting head driving portion 35 based on the mounting data in addition to the mark position recognition results on the carrier recognition marks MA and MB and the substrate recognition marks Ma and Mb.

In the present embodiment, the operation control is made by further considering position correction data that is calculated by the print inspection apparatus M2 and is feed-forwarded to the electronic component mounting apparatus M3. That is, the mounting control portion 37 is configured to control an electronic component mounting operation of the component mounting mechanism based on the position correction data and the mark position recognition result obtained by the image recognition portion 38 that is the second mark position recognition portion. A communication portion 39 transmits/receives various kinds of data, such as the above position correction data, to/from the control computer 3 or the other apparatuses provided in the electronic component mounting line 1 through the communication network 2.

In the above configuration of the electronic component mounting system, the print inspection apparatus M2 is independently provided so as to be interposed between the printing apparatus M1 and the electronic component mounting apparatus M3. However, a function of the print inspection apparatus M2 may be added to the printing apparatus M1 or the electronic component mounting apparatus M3. That is, the camera 23 is provided so that the carrier 4 after printing in the printing apparatus M1 can be imaged, and functions of the position correction data calculating portion 24, the solder position deviation calculating portion 25, the print inspection processing portion 26, the image recognition portion 27, and the inspection control portion 28 are added to the control function of the printing apparatus M1. In this case, the same inspection processing and calculation processing on the carrier 4 after printing can be performed in the printing apparatus M1. The same is true for the case in which the functions are added to the electronic component mounting apparatus M3. In this case, the same inspection on the carrier 4 directly carried from the printing apparatus M1 is executed in the electronic component mounting apparatus M3 prior to the component mounting operation. In addition, only a calculation function of the solder position deviation calculating portion 25 may be executed by the electronic component mounting apparatus M3.

Figure 6B:
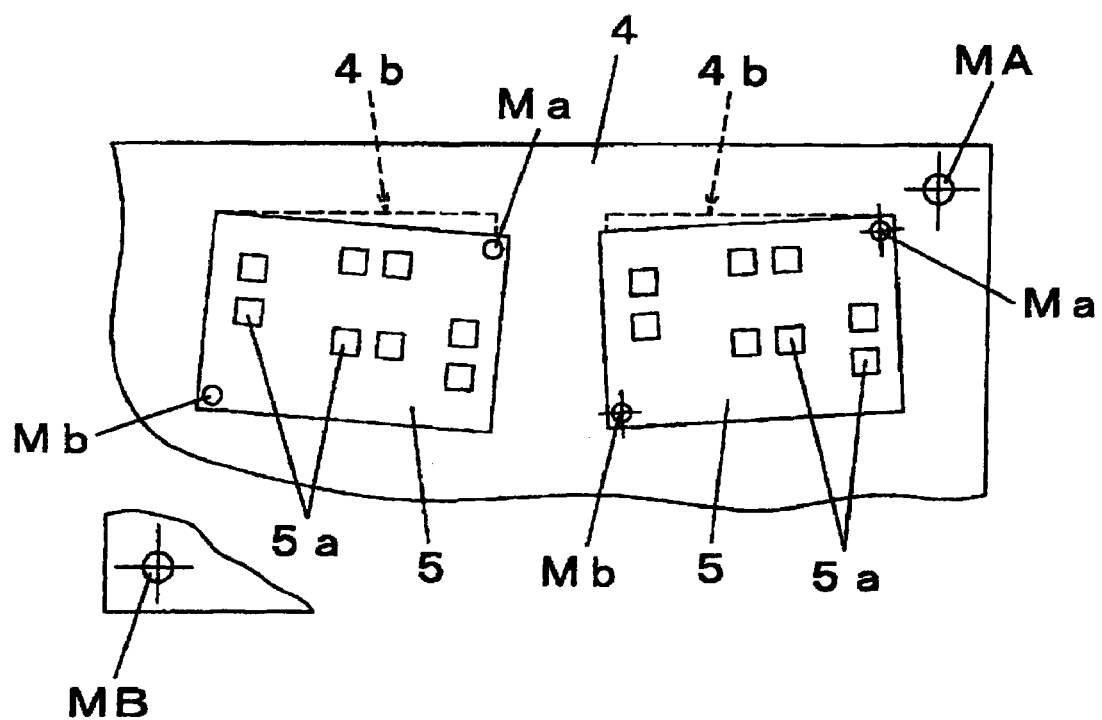

The electronic component mounting system is configured as described above. Hereinafter, an electronic component mounting method will be described in accordance with a flow shown in FIG. 9. The carrier 4 supplied from a substrate supply portion (not shown) positioned at the upstream side is first carried to the printing apparatus M1 and is then held on the carrier holding portion 11. As shown in FIG. 6B, the plurality of individual substrates 5 are held on the carrier 4. On the individual substrates 5, the plurality of electrodes 5a for attachment of electronic components are formed at positions corresponding to mounting points of electronic components so as to form a pair. In addition, the solder paste S is collectively printed on the electrodes 5a (printing process: ST1).

Then, the carrier 4 after printing is carried to the print inspection apparatus M2. Here, by causing the camera 23 to image the carrier 4 after printing and the image recognition portion 27 to perform recognition processing on the image data acquired by the imaging, print inspection for determining whether or not printing is satisfactory is performed by the print inspection processing portion 26 and processing for creating position correction data, which is used for correction of printing position deviation, for each individual substrate 5 is performed by the solder position deviation calculating portion 25 and the position correction data calculating portion 24 (ST2). Then, the calculated position correction data is feed-forwarded to electronic component mounting apparatus M3 (ST3).

Then, the electronic component mounting apparatus M3 mounts electronic components on each individual substrate 5 by controlling a component mounting mechanism based on a mark position recognition result obtained by causing the image recognition portion 38 to perform recognition processing on the image data, which is obtained when the camera 40 images the carrier 4, and the position correction data feed-forwarded from the print inspection apparatus M2 (ST4). Thereafter, the carrier 4 after electronic components are mounted on each individual substrate 5 is carried to the reflow apparatus M4 and the electronic components mounted on each individual substrate 5 are simultaneously attached to the individual substrate 5 by soldering (ST5). Thus, manufacturing of the individual mount substrate on which electronic components are mounted by soldering is completed.

Figure 11A:
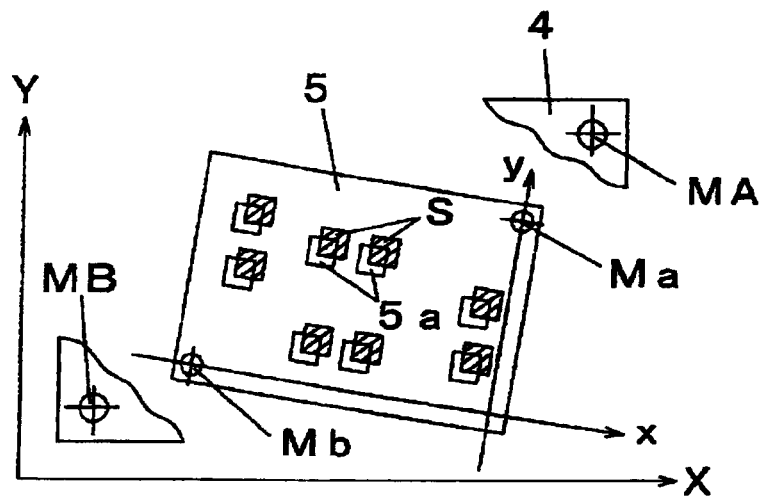
FIGS. 11A-11C are explanatory views illustrating position correction data creating processing in the electronic component mounting method according to the embodiment of the invention.
Figure 11B:
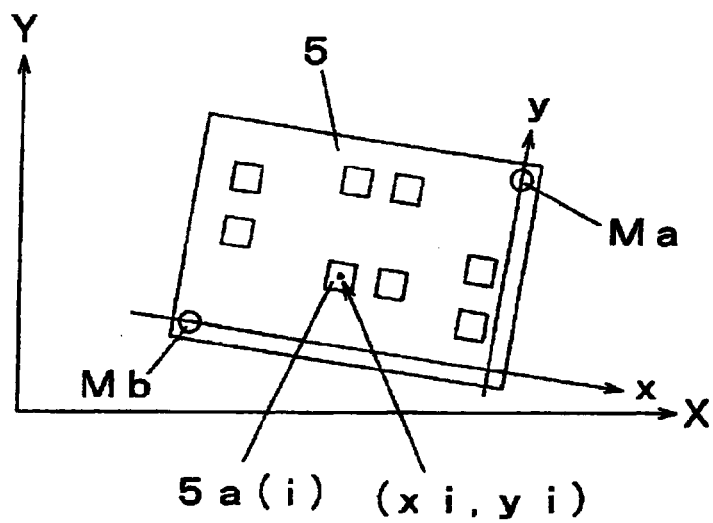
Figure 11C:
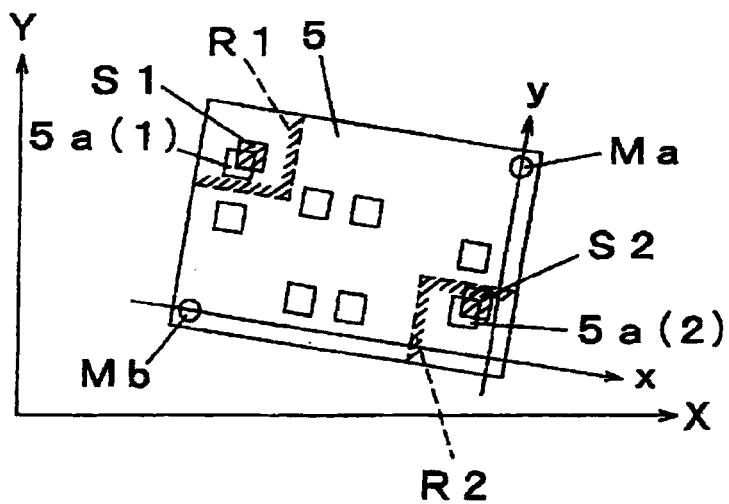

Here, the position correction data creating processing shown in the above flow (ST2) will be described in accordance with a flow shown in FIG. 10 while referring to FIGS. 11A to 11C and 12A to 12D. Moreover, in the example shown in FIGS. 11A to 11C and 12A to 12D, a case of the carrier 4 to which the individual substrate 5 is fixedly attached is illustrated. First, as shown in FIG. 11A, the carrier 4 that holds the individual substrate 5 after the solder paste S is printed is imaged, such that the positions of the substrate recognition marks Ma and Mb of each individual substrate 5 are recognized (ST11). Furthermore, in FIGS. 11A to 11C, a rectangular coordinate system XY indicates an optical coordinate system set in the camera 23, and a rectangular coordinate system xy indicates a coordinate system of each individual substrate 5 specified by the positions of the substrate recognition marks Ma and Mb. Furthermore, in FIGS. 11B and 11C, illustration of the solder paste S printed on each electrode 5a is suitably omitted. In the mark position recognition for the individual substrate 5, the positions of the carrier recognition marks MA and MB of the carrier 4 to which the individual substrate 5 is fixedly attached are recognized at the same time. As a result, the fixed relative position of each individual substrate 5 on the carrier 4 is detected, and the relative position information is feed-forwarded to the electronic component mounting apparatus M3 together with the position correction data.

Then, the position of each electrode 5a on the corresponding individual substrate 5 is calculated based on the position recognition result on the substrate recognition marks Ma and Mb and the electrode position information on the individual substrate 5 (refer to FIG. 5B) (ST12). That is, from two point positions of the substrate recognition marks Ma and Mb recognized in FIG. 11A, the rectangular coordinate system xy that is different from the rectangular coordinate system XY and is unique to the individual substrate 5 is set and the position (xi, yi) of each electrode $5a(i)$ on the rectangular coordinate system xy is calculated. The electrode position information on the individual substrate 5 is stored beforehand in a storage portion provided in each apparatus so that the electrode position information can be read as needed.

Then, the position of solder paste positioned in a position correction reference area in each individual substrate 5 is recognized (ST13). Here, the position correction reference area means regions R1 and R2 set at a pair of diagonal positions of the individual substrate 5 with a rectangular shape, as shown in FIG. 11C. The amount of positional deviation of the solder paste S(i) in the whole area of the corresponding individual substrate 5 can be estimated by calculating the amount of positional deviation of solder paste S(1) and S(2) printed on a pair of electrodes $5a(1)$ and $5a(2)$ each of which is a point selected as a representative position from the corresponding region R1 or R2.

Figure 12A:
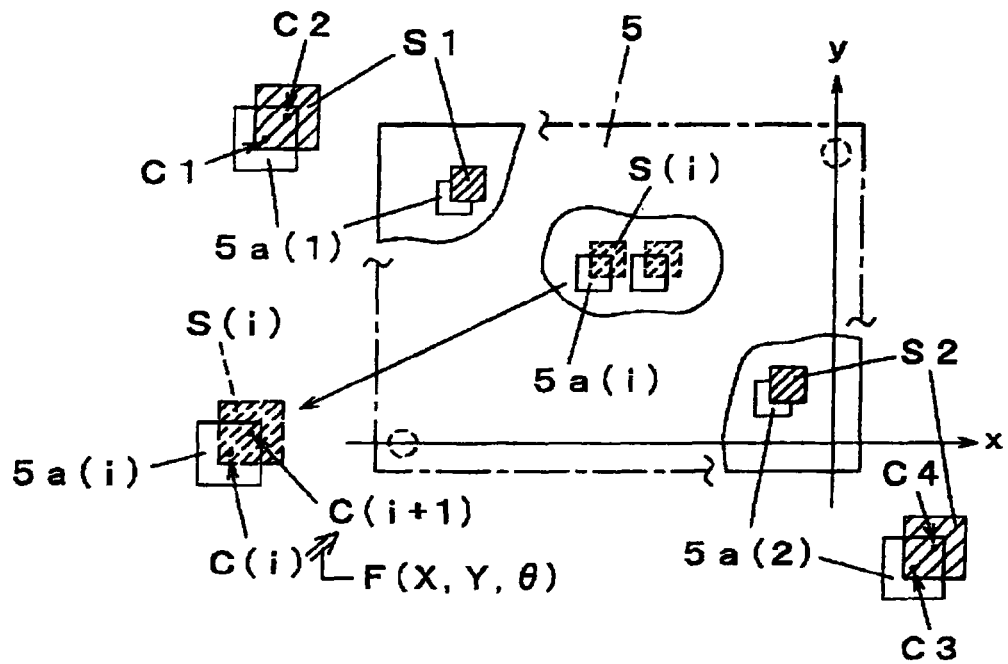
FIGS. 12A to 12D are explanatory views illustrating position correction data creating processing in the electronic component mounting method according to the embodiment of the invention.

That is, as shown in FIG. 12A, middle points C1 and C3 of the electrodes $5a(1)$ and $5a(2)$ and middle points C2 and C4 of the solder paste S(1) and S(2) are calculated by image recognition. Subsequently, the amount of displacement of the middle points C1, C2, C3, and C4 is calculated as an amount of positional deviation of the solder paste S with respect to the electrode 5a in the position correction reference area (ST14), and coordinate transformation equation $F(X, Y, \theta)$ for deriving the amount of positional deviation at an arbitrary point within the corresponding individual substrate 5 is calculated from the calculated amount of positional deviation (ST15). In other words, the coordinate transformation equation is calculated such that the middle points C1 and C3 overlap the middle points C2 and C4, respectively.

Then, the amount of solder position deviation in each electrode $5a(i)$ on the corresponding individual substrate 5 is calculated by using the calculated coordinate transformation equation $F(X, Y, \theta)$ (ST16). That is, C(i+1) obtained by performing coordinate transformation of the middle point C(i) with the coordinate transformation equation $F(X, Y, \theta)$ is estimated as a middle point of the solder paste S(i), the amount of displacement of C(i) to C(i+1) is calculated as an amount of solder position deviation in the electrode $5a(i)$, and this calculation is executed for all the electrodes 5a on the individual substrate 5.

That is, in the present embodiment, the solder position recognition portion recognizes the positions of solder paste S1 and S2, which is printed in the regions R1 and R2 that are set beforehand as position correction reference areas in each individual substrate 5, as representative positions. As a result, it is possible to efficiently calculate the amount of solder position deviation without performing imaging or image recognition processing for calculating the solder printing position for each electrode, which has been needed in the related art. It is needless to say that solder position deviation data may be calculated by performing solder position recognition for all the electrodes 5a on each individual substrate 5.

Figure 12B:
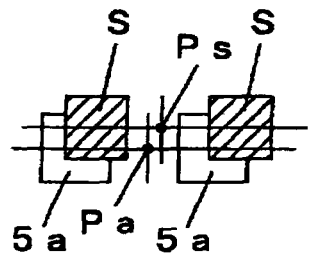

Then, an operation of the position correction data is performed. That is, by correcting the solder position deviation in each electrode 5a calculated as described above, the position correction data for mounting electronic components at proper positions is calculated as an offset value for each mounting point (ST17). Here, an example of correcting a mounting point of the terminal type electronic is component 7, which is attached to the pair of adjacent electrode 5a by soldering, is illustrated as a form of the position correction data. As shown in FIG. 12B, a mounting point in an electrode reference shown by mounting data is electrode position Pa that is a middle point of the electrode 5a. On the other hand, a mounting point in a solder reference where the position of the solder paste S that is actually printed is set as a mounting position is solder printing position Ps indicating the middle position of the solder paste S printed on the two electrodes 5a. In addition, in the case when the amount of relative position deviation between the electrode position Pa and the solder printing position Ps that are calculated is larger than a threshold value set beforehand as an allowable upper limit of positional deviation, the printing state is poor, and a determination of the poor printing state is made by the print inspection processing portion 26.

Figure 12C:
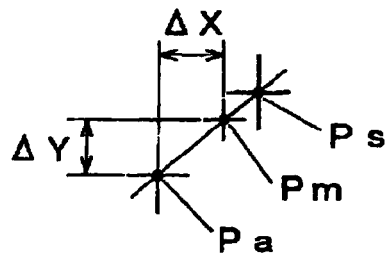
Figure 12D:
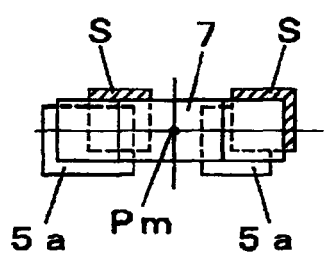

Then, if the amount of relative position deviation is less than the threshold value, an offset value (ΔX, ΔY) indicating a deviation between the electrode position Pa and a component mounting position Pm set based on the electrode position Pa and the solder printing position Ps is calculated as shown in FIG. 12C. Here, the component mounting position Pm is set at the position, which is close to the solder printing position Ps from the middle point of Pa and Ps, on a straight line that connects the electrode position Pa with the solder printing position Ps. When the printed solder paste S is positioned to deviate from the electrode, it is experientially known that a satisfactory result of soldering is obtained in a case where a position slightly shifted from the solder printing position Ps toward the electrode position Pa is set as the component mounting position Pm rather than a case where the solder printing position Ps itself is set as the component mounting position Pm.

In order to calculate the optimal component mounting position, it is preferable to perform a mounting operation while gradually shifting the component mounting position Pm and to experimentally calculate the relationship between the position of the component mounting position Pm and a frequency of occurrence of poor mounting in advance since the occurrence frequency distribution in individual poor mounting varies according to the electrode shape of a substrate, the size and shape of an electronic component, viscosity of solder paste, and the like. Then, a position where total occurrence of poor mounting is a minimum is set as the component mounting position Pm.

Calculation of the offset value is performed for all of the electrodes 5a of each individual substrate 5 held on the carrier 4, and the offset value is feed-forwarded as position correction data to the electronic component mounting apparatus M3. Then, in the electronic component mounting apparatus M3, a component mounting operation is executed based on mounting data stored in the mounting data storage portion 36, that is, mounting coordinate data indicating the position of a mounting point in the targeted individual substrate 5 as well as the mark recognition result, which is obtained by imaging the carrier 4 by the camera 40, and the position correction data that is feed-forwarded.

That is, the component mounting operation is executed after correcting a positional deviation error of design mounting position, which is caused by positioning of the carrier 4 and the relative position deviation of the individual substrate 5, according to the mark recognition result and then correcting the solder position deviation with the position correction data that is feed-forwarded from the print inspection apparatus M2. In this case, since the relative position of each individual substrate 5 to the carrier recognition marks MA and MB formed on the carrier 4 is already acquired in the print inspection apparatus M2 and is feed-forwarded to the electronic component mounting apparatus M3 together with the position correction data, only the positions of the carrier recognition marks MA and MB of the carrier 4 are preferably recognized.

The electronic component mounting method described above is an electronic component mounting method of mounting electronic components on the plurality of individual substrates 5, which are held on the carrier 4 in a state where the positions are fixed, by soldering to thereby manufacture an individual mounted board. The electronic component mounting method includes the following processes. First, the printing apparatus M1 prints the solder paste S on the plurality of electrodes 5a for attachment of electronic components, which are formed on each of the plurality of individual substrates 5, at the same time (printing process).

Then, by carrying the carrier 4 after printing to the print inspection apparatus M2 and performing recognition processing on image data obtained by imaging the carrier 4 with the camera 23, the positions of the carrier recognition marks MA and MB formed on the carrier 4 and the positions of the substrate recognition marks Ma and Mb formed on the individual substrate 5 are recognized (first mark position recognition process) and the position of the solder paste S printed on the individual substrate 5 is detected (solder position recognition process).

In the print inspection apparatus M2, solder position deviation data indicating the positional deviation of the solder paste S on each individual substrate 5 is calculated for each individual substrate 5 based on a mark position recognition result on the substrate recognition marks Ma and Mb in the first mark position recognition process, a solder position recognition result in the solder position recognition process, and electrode position information indicating the position of the electrode 5a on the individual substrate 5 (solder position deviation calculating process). This calculation of solder position deviation is performed according to the method shown in steps ST12 to ST16 of FIG. 10.

Subsequently, the position correction data calculating portion 24 performs an operation of calculating position correction data, which is used to correct the positional deviation of the solder paste S to mount electronic components at proper positions, based on solder position deviation data for each individual substrate 5 (position correction data calculating process), and the position correction data is feed-forwarded to the electronic component mounting apparatus M3. Furthermore, relative position information indicating the relative position of each individual substrate 5 on the carrier 4 calculated in the first mark position recognition process is feed-forwarded together with the position correction data. In addition, each of the following processes is executed in the electronic component mounting apparatus M3. First, the camera 40 images the carrier 4 after printing solder paste so that the positions of the carrier recognition marks MA and MB are recognized (second mark position recognition process).

Then, by controlling an operation of the component mounting mechanism for mounting electronic components based on the mark position recognition results obtained in the first mark position recognition process and the second mark position recognition process and the position correction data feed-forwarded from the print inspection apparatus M2, an electronic component from a component supply portion is picked by the mounting head 32 and is then mounted on each individual substrate 5 on which the solder paste S is printed (component mounting process).

Moreover, in the case of manufacturing individual mounted boards for the plurality of individual substrates 105, which are held in the substrate holding portions 104a provided in the carrier 104 shown in FIGS. 7A to 7C in a state in which there is a positioning error, by using the same electronic component mounting line 1, work processing in the following processes is different from that in the electronic component mounting method described above. First, in the first mark recognition process executed by the print inspection apparatus M2, only the positions of the substrate recognition marks Ma and Mb formed on each individual substrate 105 are recognized. This is because the individual substrate 105 always has a position error caused by dimensional tolerance within the substrate holding portion 104a and the relative position of the individual substrate 105 within the carrier 104 is always changed, and accordingly, there is no advantage in calculating the relative position beforehand. The solder position deviation calculating process and the position correction data calculating process are the same as those in the above example related to the carrier 4 and the individual substrate 5.

Furthermore, in the second mark position recognition process performed by carrying the carrier 104, which holds the individual substrate 105 after printing thereon, to the electronic component mounting apparatus M3, all substrate recognition marks Ma and Mb of the held individual substrate 105 are recognized. This is because relative position information indicating the relative position of the individual substrate 105 with respect to the carrier 104 is not acquired in the first mark position recognition process of the print inspection apparatus M2. Furthermore, in the electronic component mounting operation, a component mounting mechanism is controlled based on the mark position recognition result on the substrate recognition marks Ma and Mb and the position correction data feed-forwarded from the print inspection apparatus M2.

As described above, in the electronic component mounting method illustrated in the present embodiment, there is adopted a configuration in which solder position deviation data indicating the positional deviation of the solder paste S on each individual substrate 5 is calculated for each individual substrate 5 based on the mark position recognition result on the substrate recognition marks Ma and Mb, the solder position recognition result on the printed solder paste S, and electrode position information indicating the position of the electrode 5a on the individual substrate 5, an operation of calculating position correction data, which is used to correct the positional deviation to mount electronic components at proper positions, is performed for each individual substrate 5 based on the calculated solder position deviation data, and an electronic component mounting operation of the component mounting mechanism is controlled based on the mark position recognition result and the position correction data feed-forwarded in the electronic component mounting apparatus M3. Accordingly, even when the position of an individual substrate on the carrier varies, mounting position correction can be efficiently performed.

The electronic component mounting system and the electronic component mounting method according to the embodiments of the invention are advantageous in that mounting position correction corresponding to the solder printing position can be efficiently performed in a component mounting form where a plurality of individual substrates are held on a carrier. In addition, the electronic component mounting system and the electronic component mounting method according to the embodiments of the invention are useful in a field in which an individual mounted board is manufactured by mounting electronic components on a plurality of individual substrates held on a carrier by soldering.

The present application is based on Japanese patent application No. 2007-135133, the entire contents of which are incorporated herein by reference.

What is claimed is:

1. An electronic component mounting system that mounts electronic components on a plurality of individual substrates held in a carrier by soldering to thereby manufacture individual mounted boards, comprising:
    a printing apparatus that collectively prints solder paste on a plurality of the electrodes for attachment of electronic components formed on each individual substrate;
    a print inspection apparatus having a first mark position recognition portion capable of recognizing a position of a carrier-recognition mark formed on the carrier and a position of a substrate recognition mark formed on each individual substrate, a solder position recognition portion that recognizes a position of the printed solder paste, and a solder position deviation calculating portion that calculates solder position deviation data for each individual substrate indicating positional deviation of the solder paste on each individual substrate based on a mark position recognition result obtained by the first mark position recognition portion, a solder position recognition result obtained by the solder position recognition portion and electrode position information indicating positions of the electrodes on each individual substrate;
    a position correction data calculating portion that performs an operation of calculating position correction data, which is used to correct the positional deviation to mount the electronic components at proper positions, based on the solder position deviation data for each individual substrate; and
    an electronic component mounting apparatus having a component mounting mechanism that picks up the electronic components from a component supply portion by a mounting head and mounts the electronic components on each individual substrate on which the solder paste is printed, a second mark position recognition portion capable of recognizing the position of the carrier recognition mark and a position of the substrate recognition mark, and a mounting control portion that controls an electronic component mounting operation of the component mounting mechanism based on the position correction data and the mark position recognition result obtained by the second mark position recognition portion.

2. The electronic component mounting system according to claim 1, wherein the solder position recognition portion recognizes the position of the solder paste as a representative position that is printed in a position correction reference area which is set beforehand in each individual substrate.

3. The electronic component mounting system according to claim 1, wherein the position correction data calculating portion is provided in the print inspection apparatus.

4. An electronic component mounting method of mounting electronic components on a plurality of individual substrates held on a carrier such so as to be fixed by an adhesive resin coat provided on a surface of the carrier by soldering to thereby manufacture individual mounted boards, comprising:
    printing solder paste collectively on a plurality of electrodes for attachment of the electronic components on each individual substrate; performing a first mark position recognition process of recognizing a position of a carrier recognition mark formed on the carrier and a position of a substrate recognition mark formed on each individual substrate;
    performing a solder position recognition process of detecting a position of the printed solder paste;
    performing a solder position deviation calculating process of calculating solder position deviation data for each individual substrate indicating positional deviation of the solder paste on each individual substrate and a relative position of each individual substrate with respect to the carrier based on a mark position recognition result obtained in the first mark position recognition, a solder position recognition result obtained in the solder position recognition, and electrode position information indicating positions of the electrodes on each individual substrate;
    performing a position correction data calculating process of calculating position correction data, which is used to correct the positional deviation to mount the electronic components at proper positions, based on the solder position deviation data for each individual substrate;

performing a second mark position recognition process of recognizing the position of the carrier recognition mark on the carrier after printing the solder paste; and performing a component mounting process of picking up the electronic components from a component supply portion by a mounting head and mounting the electronic components on each individual substrate on which the solder paste is printed by controlling an electronic component mounting operation of a component mounting mechanism based on the position correction data and the mark position recognition result obtained in the second mark position recognition process.

5. The electronic component mounting method according to claim 4, wherein in the solder position recognition process, the position of solder paste printed in a position correction reference area which is set beforehand in each individual substrate is recognized as a representative position.

* * * * *